(12) United States Patent
Kao et al.

(10) Patent No.: US 12,394,771 B2
(45) Date of Patent: Aug. 19, 2025

(54) SEMICONDUCTOR DIE ASSEMBLIES WITH SIDEWALL PROTECTION AND ASSOCIATED METHODS AND SYSTEMS

(71) Applicant: Micron Technology, Inc., Boise, ID (US)

(72) Inventors: Yu Lin Kao, Taichung (TW); Chun Min Lin, Taichung (TW); Sui Chi Huang, Taichung (TW); Pei Sian Shao, Taichung (TW)

(73) Assignee: Micron Technology, Inc., Boise, ID (US)

( * ) Notice: Subject to any disclaimer, the term of this patent is extended or adjusted under 35 U.S.C. 154(b) by 590 days.

(21) Appl. No.: 17/668,306

(22) Filed: Feb. 9, 2022

(65) Prior Publication Data

US 2023/0068435 A1    Mar. 2, 2023

Related U.S. Application Data

(60) Provisional application No. 63/304,208, filed on Jan. 28, 2022, provisional application No. 63/238,101, filed on Aug. 27, 2021.

(51) Int. Cl.
*H01L 25/18* (2023.01)
*H01L 21/56* (2006.01)
(Continued)

(52) U.S. Cl.
CPC ............ *H01L 25/18* (2013.01); *H01L 21/561* (2013.01); *H01L 21/568* (2013.01); *H01L 21/78* (2013.01);
(Continued)

(58) Field of Classification Search
CPC ..... H01L 25/18; H01L 21/561; H01L 21/568; H01L 21/78; H01L 23/3121; H01L 23/481; H01L 25/50; H01L 2221/68345; H01L 2221/68359; H01L 2221/68363; H01L 21/6835; H01L 25/043; H01L 25/0657; H01L 25/074; H01L 25/0756; H01L 25/117; H01L 2225/06503–06596;
(Continued)

(56) References Cited

U.S. PATENT DOCUMENTS

2020/0395338 A1* 12/2020 Hsu .................... H01L 24/08
2020/0402960 A1* 12/2020 Chen .................. H01L 23/3121

* cited by examiner

*Primary Examiner* — Cuong B Nguyen
(74) *Attorney, Agent, or Firm* — Dorsey & Whitney LLP

(57) ABSTRACT

Semiconductor die assemblies with sidewall protection, and associated methods and systems are disclosed. In one embodiment, a semiconductor die assembly includes an interface die with a low-k dielectric layer and a stack of semiconductor dies attached to the interface die. The semiconductor die assembly also includes a molding structure that protects sidewalls of the interface die and sidewalls of the semiconductor dies. In some embodiments, the semiconductor die assembly includes a passivation layer attached to the interface die opposite to the stack of semiconductor dies. Further, the passivation layer may include a sidewall surface coplanar with an outer sidewall surface of the molding structure. The passivation layer may include a ledge underneath the molding structure, which is uncovered by the interface die. The semiconductor die assembly may include a NCF material at the sidewalls of the stack of semiconductor dies, where the molding structure surrounds the NCF material.

12 Claims, 13 Drawing Sheets

(51) Int. Cl.
*H01L 21/78* (2006.01)
*H01L 23/31* (2006.01)
*H01L 23/48* (2006.01)
*H01L 25/00* (2006.01)

(52) U.S. Cl.
CPC ........ *H01L 23/3121* (2013.01); *H01L 23/481* (2013.01); *H01L 25/50* (2013.01)

(58) Field of Classification Search
CPC . H01L 25/0652; H01L 25/071; H01L 25/112; H01L 2225/06506–06551; H01L 2225/1041–107; H01L 2225/06541–06544
See application file for complete search history.

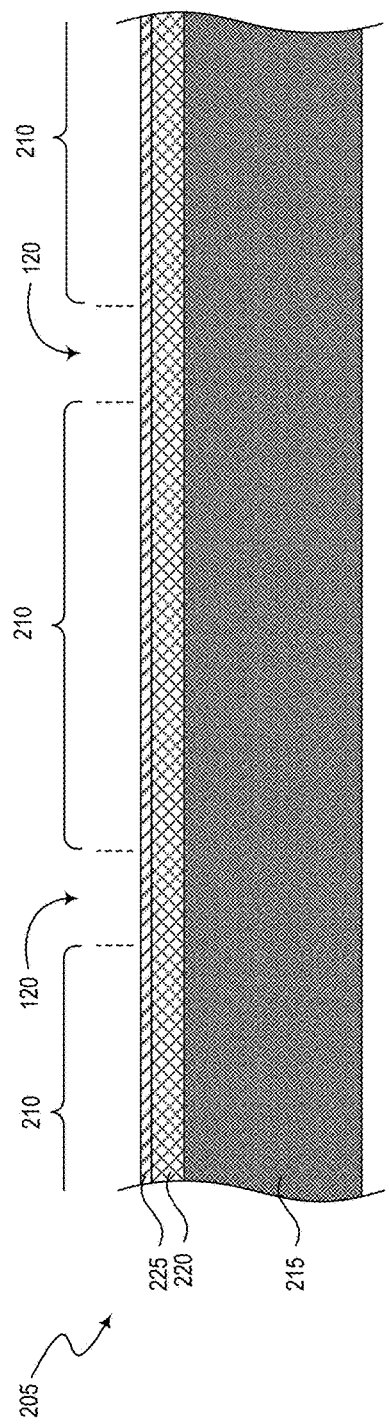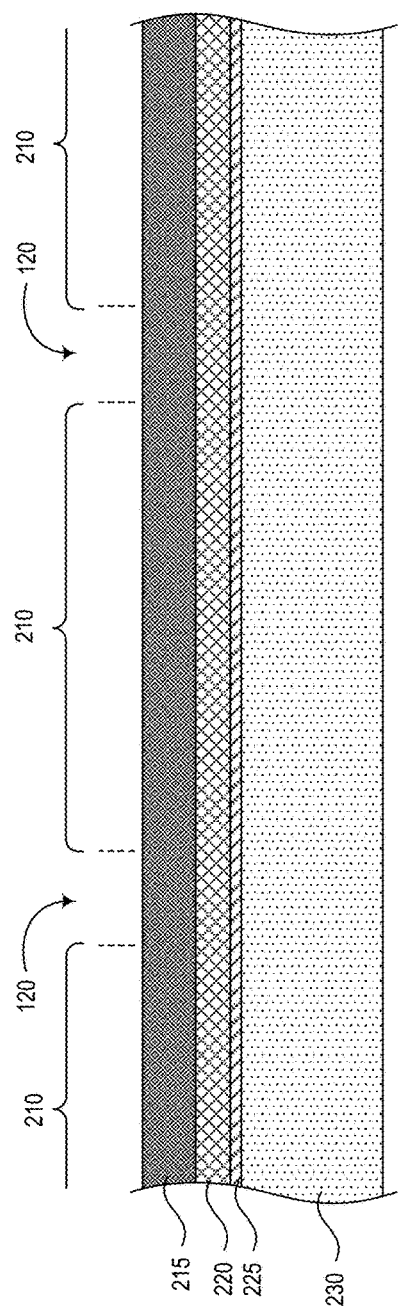
Figure 2A
Figure 2B

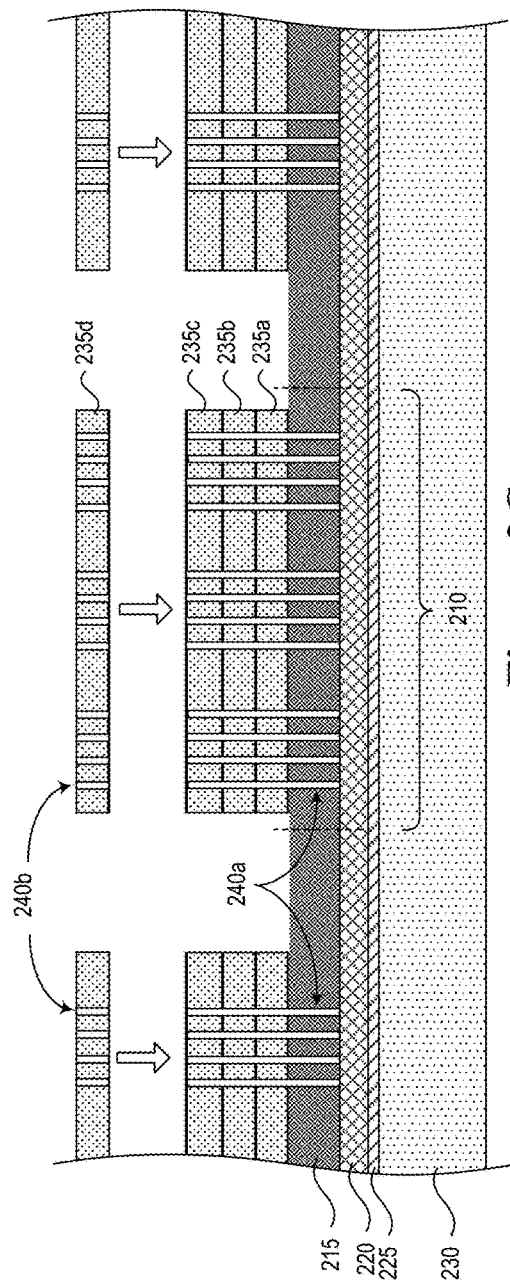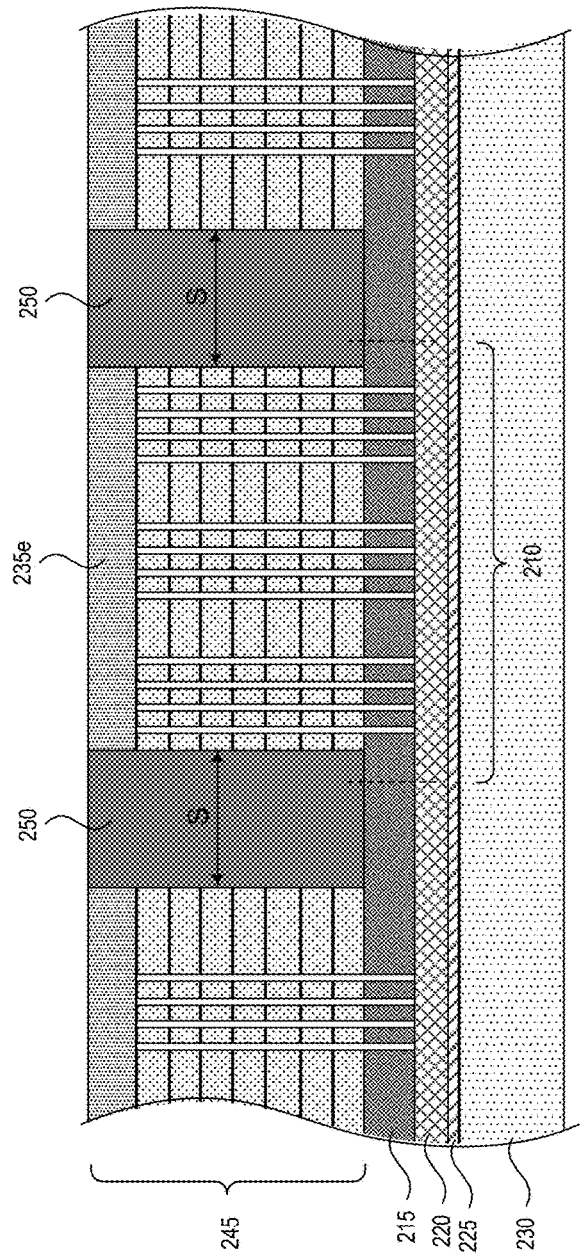

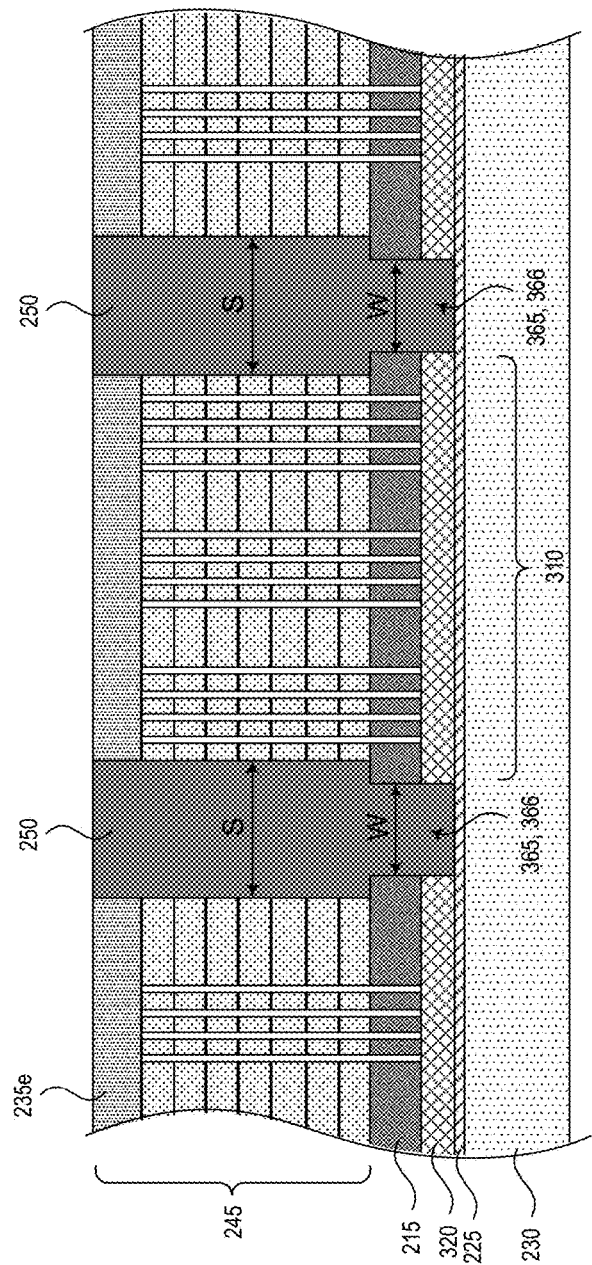
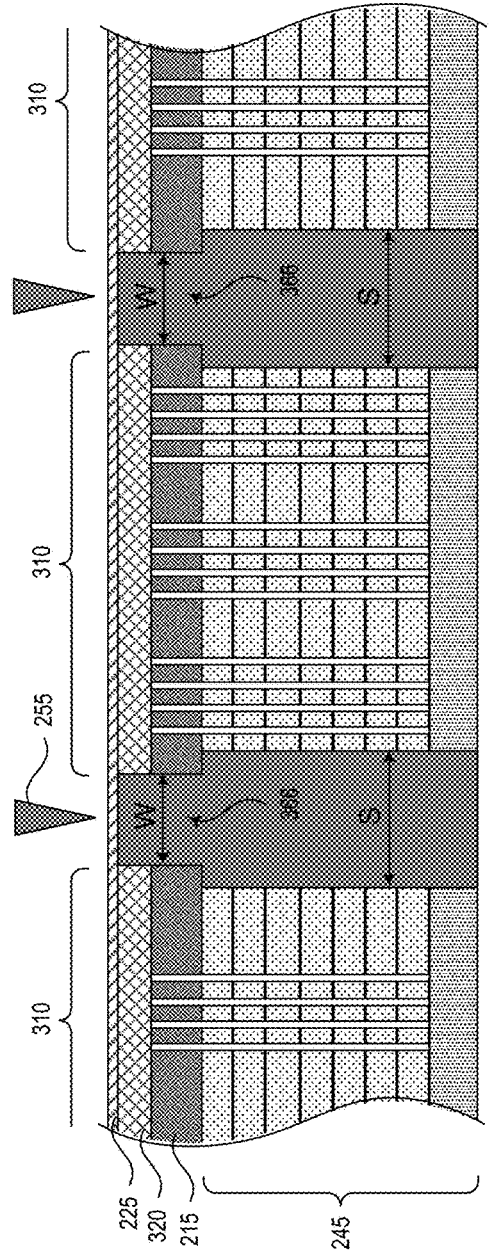
Figure 3E
Figure 3F

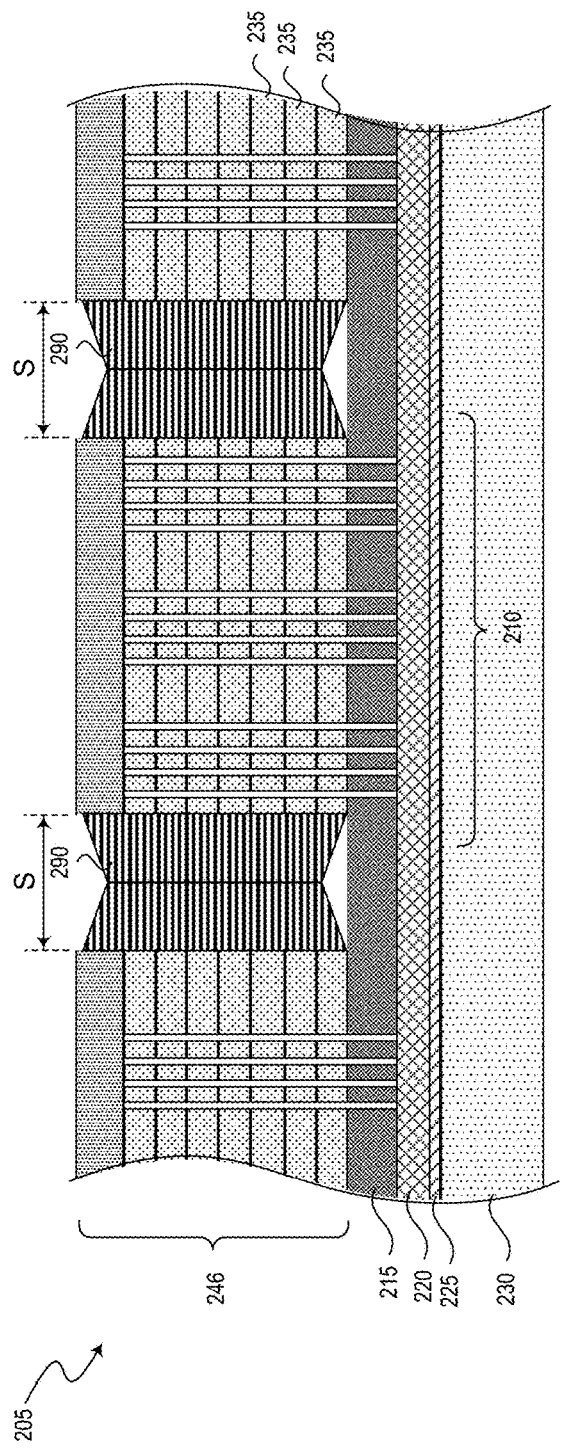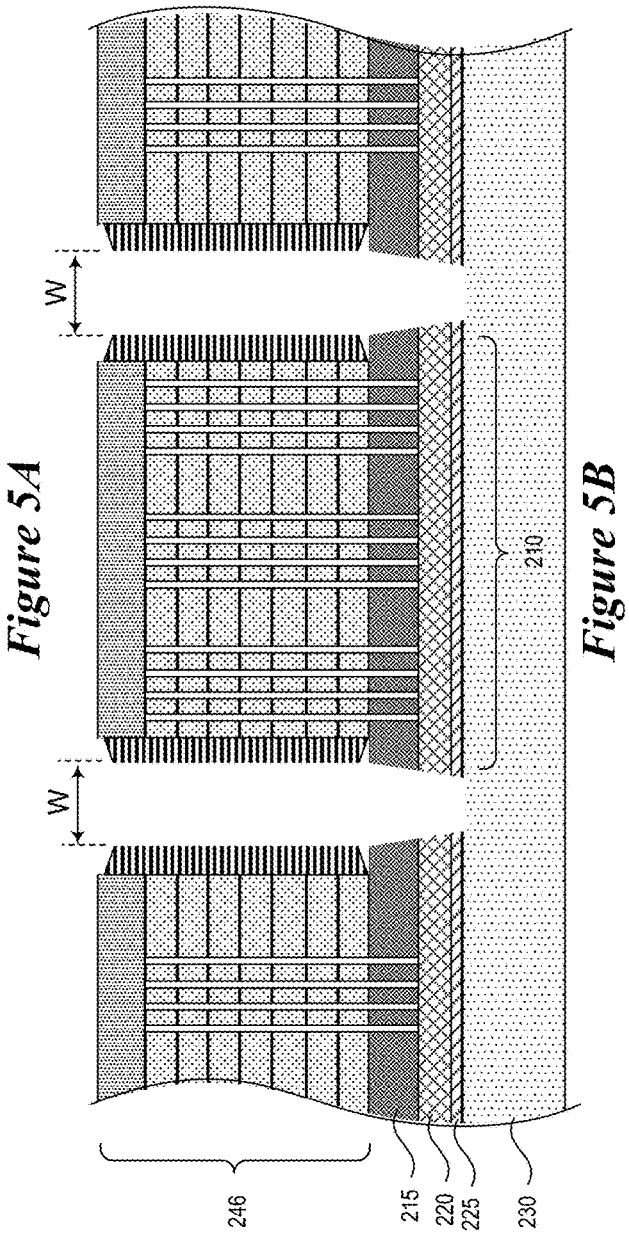
Figure 5A
Figure 5B

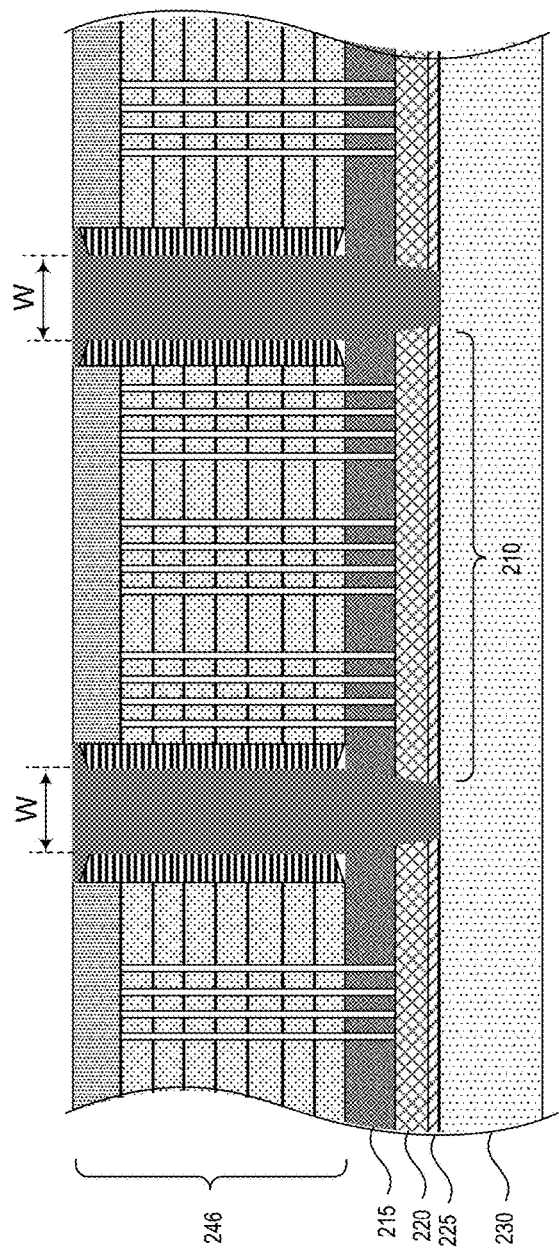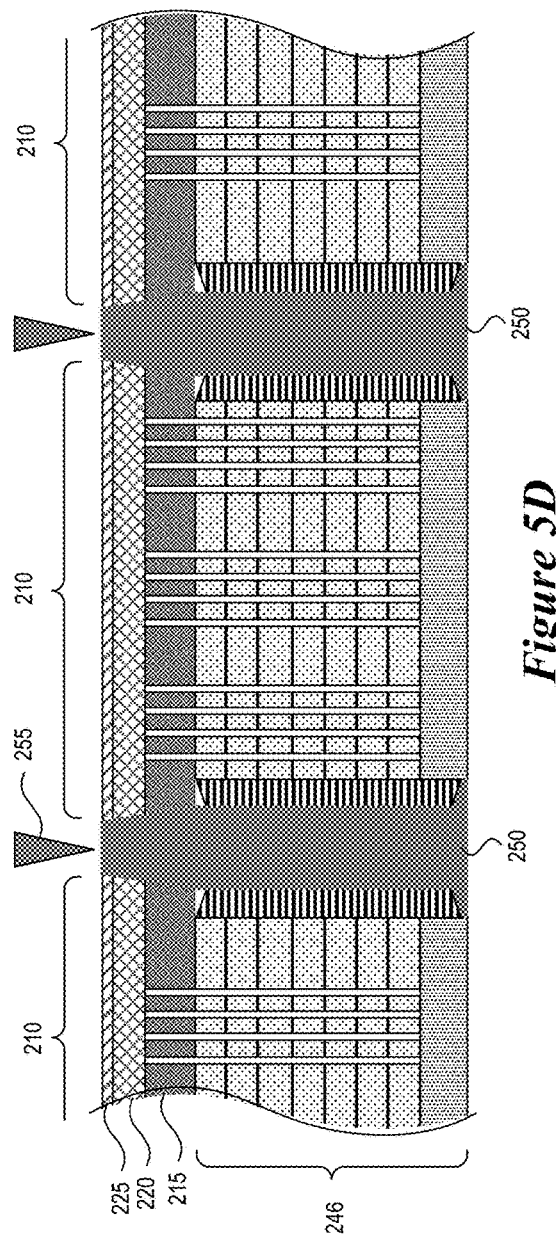

SEMICONDUCTOR DIE ASSEMBLIES WITH SIDEWALL PROTECTION AND ASSOCIATED METHODS AND SYSTEMS

CROSS-REFERENCE TO RELATED APPLICATIONS

The present application claims priority to U.S. Provisional Patent Application Nos. 63/238,101, filed Aug. 27, 2021, and 63/304,208, filed Jan. 28, 2022; the disclosures of which are incorporated herein by reference in their entirety.

TECHNICAL FIELD

The present disclosure generally relates to semiconductor die assemblies, and more particularly relates to semiconductor die assemblies with sidewall protection and associated methods and systems.

BACKGROUND

Semiconductor packages typically include a semiconductor die (e.g., memory chip, microprocessor chip, imager chip) mounted on a substrate and encased in a protective covering (e.g., an encapsulating material). The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

Market pressures continually drive semiconductor manufacturers to reduce the size of semiconductor packages to fit within the space constraints of electronic devices. In some semiconductor packages, direct chip attach methods (e.g., flip-chip bonding between the semiconductor die and the substrate) may be used to reduce the footprint of the semiconductor packages. Such direct chip attach methods include directly connecting multiple conductive pillars electrically coupled to the semiconductor die to corresponding conductive structures (e.g., conductive bumps) of the substrate. In this regard, a solder structure may be formed over individual conductive pillars for bonding the conductive pillars to the corresponding conductive structures—e.g., forming interconnects (which may be referred to as joints) that include the conductive pillar, the solder structure, and the conductive bump. Further, an encapsulating material can be applied to protect the semiconductor die.

BRIEF DESCRIPTION OF THE DRAWINGS

Many aspects of the present technology can be better understood with reference to the following drawings. The components in the drawings are not necessarily to scale. Instead, emphasis is placed on clearly illustrating the principles of the present technology.

FIGS. 2A through 2F illustrate stages of a process for forming semiconductor die assemblies.

FIGS. 3A through 3F illustrate stages of a process for forming semiconductor die assemblies in accordance with embodiments of the present technology.

FIGS. 5A through 5D illustrate stages of a process for forming semiconductor die assemblies in accordance with embodiments of the present technology.

DETAILED DESCRIPTION

Figure 1:
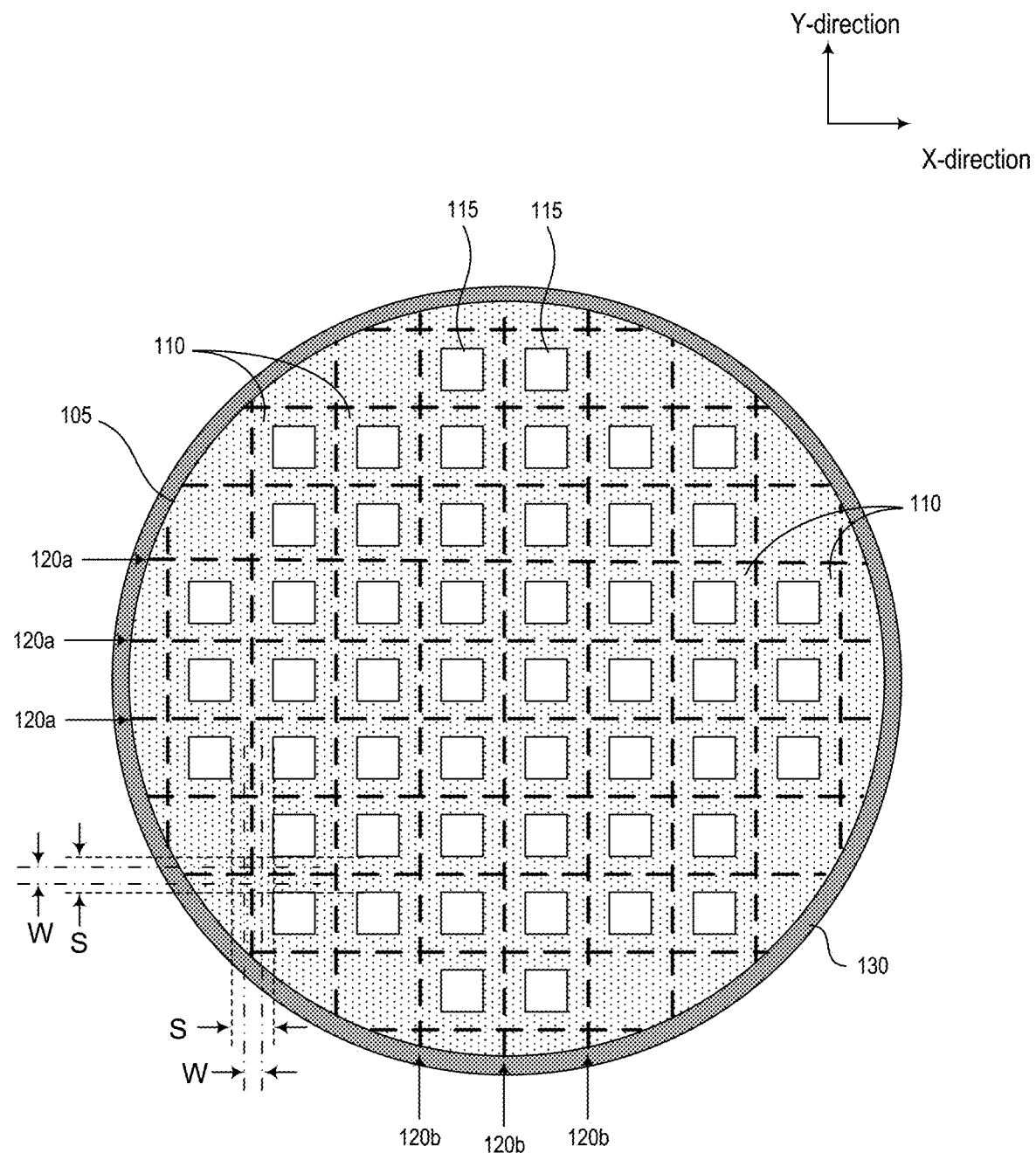
FIG. 1 is a diagram of an interface wafer with stacks of semiconductor dies in accordance with embodiments of the present technology.

Specific details of several embodiments directed to providing sidewall protection for semiconductor die assemblies, and associated systems and methods are described below. Wafer level packaging (WLP) can provide scaled form factors for semiconductor die assemblies (semiconductor device assemblies). The WLP techniques utilizes an interface wafer including interface dies, to which semiconductor dies or stacks of semiconductor dies (e.g., active dies, known good dies, memory dies) are attached. Individual semiconductor dies (or stacks of semiconductor dies) are aligned with and electrically connected to corresponding interface dies of the interface wafer. The interface dies may include different types of semiconductor dies (e.g., logic dies, controller dies, memory controller dies) than the semiconductor dies (e.g., memory dies) attached to the interface dies or interposer dies with redistribution layers (RDLs) configured to route electrical signals between the semiconductor dies (or the semiconductor dies of the stacks) and higher level circuitry (e.g., processors, host devices).

In some embodiments, the interface wafer includes a dielectric layer configured to provide electrical connections between integrated circuitry formed in a semiconductor substrate of the interface dies and conductive components (e.g., bond pads, conductive bumps) formed in the dielectric layer to provide external connections for the interface dies. As such, the dielectric layer may include one or more metallic layers and vias between the metallic layers. In some embodiments, the dielectric layer includes one or more dielectric materials with relatively low dielectric constants (which may also be referred to as low-k dielectric materials) than conventional dielectric materials to reduce parasitic capacitance associated with the dielectric layer. The conventional dielectric materials (e.g., silicon oxides, silicon nitrides, or silicon oxynitrides) have dielectric constants of approximately 3.5 or greater whereas the low-k dielectric materials have dielectric constants less than 3.5. The low-k dielectric materials, however, tend to have inferior physical properties when compared to the conventional dielectric materials—e.g., poor interlayer adhesion, low modulus (hardness), inferior cohesive strength. As such, integrating the low-k materials may present challenge for robust yield and reliability for semiconductor die assemblies.

In some embodiments, a passivation layer (e.g., silicon nitride layer) is formed on the dielectric layer of the interface wafer. The passivation layer may protect the dielectric layer during subsequent process steps. For example, during WLP process steps, the interface wafer may be attached to a carrier wafer (e.g., a glass carrier wafer) with the dielectric layer facing the carrier wafer—e.g., using an adhesive layer. Accordingly, the passivation layer can provide a buffer between the dielectric layer (e.g., dielectric layers including low-k materials) and the carrier wafer—e.g., while the interface wafer is thinned prior to attaching semiconductor dies. Additionally, or alternatively, the passivation layer can provide a protective barrier against the adhesive materials.

For certain semiconductor die assemblies, sizes of interface dies are greater than areas occupied by the semiconductor dies (or stacks of semiconductor dies) that they carry. Accordingly, there are spaces between adjacent stacks of semiconductor dies, and the spaces include scribe lines (which may also be referred to as dicing lanes, dicing streets, cutting lines, or the like) between the interface dies. A ratio between a total area occupied by the semiconductor dies and a total area of interface wafer may be referred to as a die ratio.

After semiconductor dies (or the stacks of semiconductor dies) have been attached to the interface wafer, which may be referred to as chips-on-wafer (CoW), an encapsulating material (e.g., mold compound materials, epoxy molding compounds (EMC), molding materials) can be disposed over the interface wafer. In some embodiments, the semiconductor dies (or the stacks of semiconductor dies) are immersed in the encapsulating material. Further, the spaces between the stacks of semiconductor dies are filled with the encapsulating material. Subsequently, the encapsulating material may be cured at an elevated temperature to harden the encapsulating material to improve protection for the semiconductor dies. In some embodiments, the excess encapsulating material above the semiconductor dies (or the stacks of semiconductor dies) is removed using a grinding process step. The process steps to provide protection for the semiconductor dies using the encapsulating material may be referred to as a molding process.

In some embodiments, the molding process may introduce stress throughout the interface wafer carrying the stacks of semiconductor dies, at least partially due to the mismatch in coefficients of thermal expansion (CTE). For example, the encapsulating material may have a CTE of three (3) to four (4) times greater that the CTE of silicon. Due to the mismatch in the CTE values, the interface wafer carrying the stacks of semiconductor dies may deform (e.g., bowing up or down, warped, distorted). Such interface wafer warpage can be exacerbated if the die ratio is relatively small—i.e., relatively large amount of the encapsulating material over the interface wafer. In some case, the interface wafer warpage can be severe to cause difficulties in downstream process steps. For example, the wafer warpage may render vacuum chucking of the interface wafer difficult for the grinding process step.

After the molding process, the carrier wafer may be detached from the interface wafer. Subsequently, dicing steps may follow to singulate (e.g., sever, separate) individual semiconductor die assemblies (e.g., an interface die carrying a stack of semiconductor dies) along the scribe line. In some embodiments, the singulation process steps utilize a dicing saw (a singulation blade or saw) to cut the interface wafer and the encapsulating material in the spaces between the stacks of semiconductor dies, which may be referred to as a blade singulation process. As such, the dicing saw cuts through the passivation layer, the dielectric layer and the semiconductor substrate of the interface die, and the encapsulating material. As the dicing saw cuts through the multiple layers with different material properties, this may be referred to as a heterogeneous material singulation process. During the heterogeneous material singulation process, one or more layers of the heterogeneous materials may be subject to undesired influence of the coarse mechanical nature of the dicing process. For example, the low-k materials of the dielectric layer can be torn apart, delaminated, or otherwise damaged.

The present technology is devised to facilitate relieving wafer-level stress for WLP process—e.g., during the molding process. Additionally, or alternatively, the present technology can reduce (e.g., mitigate) the adverse effect of singulating the heterogeneous materials—e.g., during the heterogeneous material singulation process. For example, the dielectric layer can be modified such that metallic layers and vias within the dielectric layer are removed (or relocated) from the regions of the dielectric layer including (or corresponding to) the scribe lines. In this manner, the dielectric layer and the semiconductor substrate the regions can be removed using a plasma dicing process, prior to the molding process and the blade singulation process. The plasma dicing process is expected to reduce the undesired influence of the blade singulation process to the dielectric layer (e.g., to the low-k materials of the dielectric layer).

As a result of removing the dielectric layer and the semiconductor substrate in the regions including the scribe lines, the interface dies (while attached to the carrier wafer) are singulated into individual interface dies. Accordingly, the wafer-level stress across the entire interface wafer during the molding process is expected to be locally confined at individual interface die level—e.g., at least due to the spaces between the interface dies. Further, the interface dies have the sidewalls of the dielectric layer and the semiconductor substrate covered by the encapsulating material such that the sidewall surfaces are protected during the subsequent process steps (e.g., blade singulation steps, dicing steps using the dicing saw) and during the lifetime of the semiconductor die assembly. Moreover, the heterogeneous material dicing process is simplified as the number of layers for the dicing saw to cut is reduced (e.g., to the passivation layer and the encapsulating material) in view of the dielectric layer and the semiconductor substrate of the interface dies having been removed.

In some embodiments, a laser dicing process can be utilized without having to remove (relocate or otherwise prearranging) the metallic structures (e.g., metal layers and/or vias therebetween) in the dielectric layer by taking advantage of the laser dicing process capable of handling the metallic structures in the dielectric layer—e.g., safely removing the metallic structure without introducing adverse effect to the dielectric layer (e.g., to the low-k materials of the dielectric layer). The laser dicing process may be referred to as a full laser cutting process.

In some embodiments, while the semiconductor dies (e.g., memory dies) are stacked on top of another above the interface wafer, a non-conductive film (NCF) material is disposed between adjacent semiconductor dies. The NCF material may be a dielectric material configured to provide insulation between the adjacent semiconductor dies and among interconnect structures (e.g., joints connecting the adjacent semiconductor dies) located between them. Moreover, the NCF material can flow relatively freely during the stacking process such that it can fill the space between the semiconductor dies and among the interconnect structures. In some cases, excess NCF material may squeeze out from the stack of semiconductor dies. The excess NCF material may interfere with the blade singulation steps in some cases (e.g., generating particles or debris). Moreover, the excess NCF material may contribute to the overall stress during the WLP process. The present technology utilizing the full laser dicing process is expected to ameliorate the adverse effects due to the excess NCF material.

The term "semiconductor device or die" generally refers to a solid-state device that includes one or more semiconductor materials. Examples of semiconductor devices include logic devices or dies, memory devices or dies, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level—e.g., processing steps associated with fabricating semiconductor devices (wafer-level and/or die-level) and/or manufacturing semiconductor packages.

Further, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques. Some of the techniques may be combined with photolithography processes. A person skilled in the relevant art will also understand that the technology may have additional embodiments, and that the technology may be practiced without several of the details of the embodiments described herein with reference to FIGS. 2A through 6.

As used herein, the terms "front," "back," "vertical," "lateral," "down," "up," "top," "bottom," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1 is a diagram of an interface wafer 105 (or an interface substrate) including interface dies 110. FIG. 1 depicts stacks of semiconductor dies 115 attached to the interface wafer 105. The interface wafer 105 carrying the stacks of semiconductor dies 115 may be referred to as a reconstituted wafer (or COW) in view of the singulated, individual semiconductor dies 115 aligned and attached to corresponding interface dies 110 of the interface wafer 105. Each set of an interface die 110 and a stack of semiconductor dies 115 attached to the interface die 110 can be regarded as a semiconductor die assembly—e.g., after completing the WLP process such that individual semiconductor die assemblies are packaged and singulated. Further, FIG. 1 depicts a carrier wafer 130 (which is drawn to be larger than the interface wafer 105 for illustration purposes), to which the interface wafer 105 can be attached during the WLP process.

Although the present technology is described herein with semiconductor device assemblies including a stack of semiconductor dies (e.g., the stacks of semiconductor dies 115) attached to an interface die (e.g., the interface die 110), it should be understood that the principles of the present technology is not limited thereto. For example, semiconductor device assemblies in accordance with the present technology may include a single semiconductor die attached to an interface die.

In some embodiments, the interface dies 110 are different types of semiconductor dies (e.g., logic dies, controller dies) than the semiconductor dies 115 (e.g., memory dies) of the stacks. Each one of the interface dies 110 includes integrated circuitry formed in the semiconductor substrate of the interface wafer 105. The integrated circuitry can be configured to exchange electrical signals with the semiconductor dies 115 and with higher level circuitry (e.g., a host device) coupled with the interface die 110—e.g., after completing the WLP process and being coupled with the host device. Further, the interface die 110 includes a dielectric layer (e.g., the dielectric layer 220 or 320 described with reference to FIGS. 2 through 6) configured to provide electrical connections between the integrated circuitry and conductive components (e.g., bond pads, conductive bumps), which may be later formed on the dielectric layer to provide external connections for the interface die 110. As such, the dielectric layer may include one or more metallic layers and vias between the metallic layers. In some embodiments, the dielectric layer includes one or more low-k dielectric materials to reduce parasitic capacitance associated with the dielectric layer.

In other embodiments, the interface dies 110 are interposer dies having various conductive structures (e.g., redistribution layers, vias, interconnects) configured to route electrical signals between the stacks of semiconductor dies 115 and higher level circuitry—e.g., after completing the WLP process and being coupled with a host device. For example, a central processing unit (CPU) mounted on a printed circuit board (PCB) exchanges electrical signals with the stack of semiconductor dies 115 attached to the interposer die after the semiconductor die assembly including the interposer die is also mounted on the PCB. In some embodiments, the interposer dies include one or more low-k dielectric materials to reduce parasitic capacitance associated with routing the electrical signals.

The semiconductor dies 115 of the stack can be attached on top of each other—e.g., using direct chip attach techniques, hybrid bonding techniques. In some embodiments, the semiconductor dies include memory dies (e.g., dynamic random access memory (DRAM), Not-AND (NAND) memory, phase change memory (PCM), or the like). Each semiconductor die 115 of the stack has a frontside (e.g., the active side having memory cells, integrated circuits, bond pads connected to the integrated circuits, conductive pillars connected to the bond pads, etc.) and a backside opposite to the frontside. In some embodiments, the frontside of each semiconductor die 115 faces toward the interface die 110. The uppermost semiconductor die 115 of the stack may be referred to as a top die, and one or more semiconductor dies 115 located between the top die and the interface die 110 may be referred to as core dies (or middle dies). In some embodiments, the core dies are thinned (to approximately 50 μm or so) and include through-substrate vias (TSVs) to route electrical signals from the backside to the frontside. The top dies may not be thinned in some cases. Further, the top dies may not include TSVs as they do not need to route electrical signals from other semiconductor dies.

As depicted in an embodiment shown in FIG. 1, the stacks of semiconductor dies 115 have footprints less than the interface dies 110 and are aligned with the interface dies 110 of the interface wafer 105. Accordingly, there are spaces between the stacks of semiconductor dies 115 (denoted as "S" in FIG. 1) including scribe lines 120 of the interface wafer 105, some of which are individually identified as horizontal scribe lines 120a along the x-direction and vertical scribe lines 120b along the y-direction. The spaces between the stacks of semiconductor dies 115 form channels in both x-direction and y-direction for an encapsulating material to flow during the molding process.

In some embodiments, portions of the semiconductor substrate and the dielectric layer of the interface wafer 105 are removed in the regions including the scribe lines 120 before disposing an encapsulating material on the interface wafer 105. Such regions may have a narrower width (denoted as "W" in FIG. 1) than the space S. As a result of removing the portions of the semiconductor substrate and the dielectric layer, the interface dies 110 can be separated from each other (e.g., singulated) while the interface wafer 105 (e.g., singulated interface dies 110) is attached to the carrier wafer 130. In this manner, the stress during the molding process (e.g., due to CTE mismatches between the encapsulating material and the semiconductor material (e.g., silicon of the interface wafer 105) can be localized to individual interface dies 110. In other words, the open regions corresponding to the width W between the interface dies 110 are expected to reduce (mitigate, limit, confine) the long range propagation of the stress throughout the interface wafer 105.

Figure 2E:
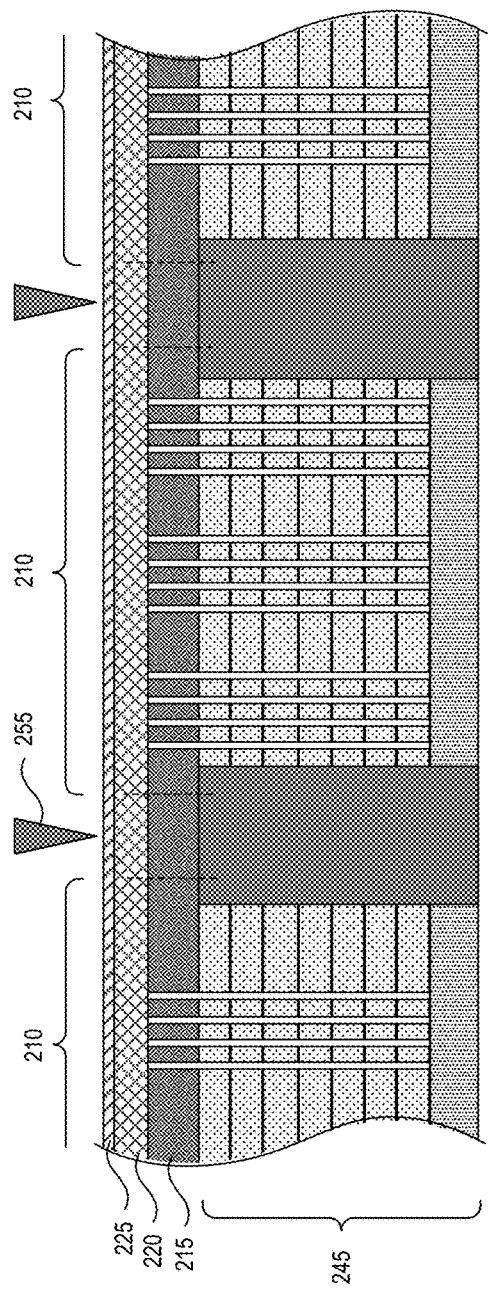

FIGS. 2A through 2F illustrate stages of a process for forming semiconductor die assemblies. FIG. 2A illustrates a cross-sectional view of a portion of an interface wafer 205. The interface wafer 205 may include aspects of the interface wafer 105 described with reference to FIG. 1. For example, the interface wafer 205 includes a semiconductor substrate 215 including integrated circuitry (not shown), and a dielectric layer 220 including one or more metallic layers and vias that are coupled with the integrated circuitry. In some embodiments, the dielectric layer 220 includes a low-k dielectric material. Moreover, the interface wafer 205 includes a passivation layer 225 (e.g., a silicon nitride layer). Also indicated in FIG. 2A are locations of interface dies 210 (which may be an example of or include aspects of the interface die 110) and the regions of the interface wafer 205 including the scribe lines 120.

FIG. 2B illustrates the interface wafer 205 attached to a carrier substrate 230 (which may be an example of or include aspects of the carrier wafer 130). As depicted in FIG. 2B, the interface wafer 205 has been flipped upside down such that the passivation layer 225 is attached to the carrier substrate 230. In some embodiments, an adhesive layer (not shown) is used to attach the interface wafer 205 to the carrier substrate 230. At this stage of the process, the interface wafer 205 (e.g., bulk of the semiconductor substrate 215) may have been thinned down—e.g., to a thickness of 50 µm or so.

FIG. 2C illustrates that TSVs 240a are formed for the interface dies 210. The TSVs 240a are configured to operatively couple the integrated circuitry of the interface die 210 with the semiconductor dies 235. Further, FIG. 2C illustrates that semiconductor dies 235 (also identified individually as 235a-d) are attached to the interface wafer 205. The semiconductor dies 235 include TSVs 240b. The TSVs 240b are configured to operatively couple the semiconductor dies 235 with the integrated circuitry of the interface dies 210.

FIG. 2D illustrates that top semiconductor dies 235e have been attached to the underlying core semiconductor dies 235 to complete the stacks 245 of semiconductor dies 235. FIG. 2D also depicts an encapsulating material 250 filling the spaces (denoted as S) between the stacks 245. As described above, the encapsulating material 250 may have covered the stacks 245, and then have been cured at an elevated temperature. The CTE mismatch between the encapsulating material 250 and other materials of the interface wafer 205 (e.g., silicon substrate 215, the stacks 245 of semiconductor dies 235) may result in stress throughout the interface wafer 205. In certain cases, the wafer-level stress may cause the interface wafer to deform—e.g., bowing up or down, warped, distorted. Further, excess encapsulating material 250 over the stacks 245 may have been removed using a grinding process. Additional stress during the grinding process may further exacerbate the stress across the interface wafer 205.

FIG. 2E illustrates that the carrier substrate 230 has been detached from the interface wafer 205 after the molding process. Further, the interface wafer 205 in FIG. 2E has been flipped upside down in comparison to FIG. 2D. Also illustrated in FIG. 2E is that a dicing blade 255 can be used to singulate individual semiconductor die assemblies each including the interface die 210 and the stack 245 of the semiconductor dies 235. As shown in the embodiment depicted in FIG. 2E, the dicing blade 255 cuts through the passivation layer 225, the dielectric layer 220, the substrate 215, and the encapsulating material 250—e.g., the heterogeneous material singulation process as described above. As the dicing blade 255 mechanically cuts through the heterogeneous materials, certain layers (e.g., the dielectric layer 220 including a low-k dielectric material) may experience undesired influence of the mechanical dicing process while other layers (e.g., the passivation layer 225, the substrate 215, the encapsulating material 250) are being cut. As a result, the dielectric layer 220 may be torn apart, delaminated, or otherwise damaged.

Figure 2F:
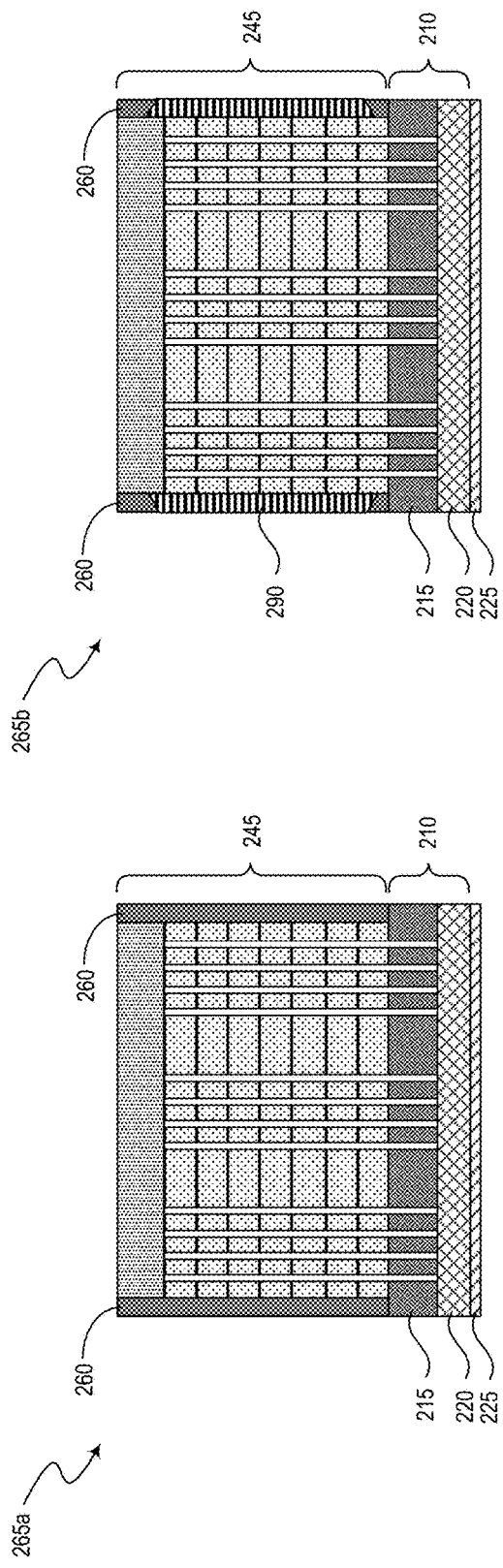

FIG. 2F illustrates a semiconductor die assembly 265a after the heterogeneous material singulation process is complete—e.g., after the blade singulation process. The semiconductor die assembly 265 is flipped upside down in comparison to that depicted in FIG. 2E. As shown in FIG. 2F, the semiconductor die assembly 265a includes a molding structure 260 with the encapsulation material 250. The molding structure 260 surrounds the sidewalls of the stack 245 (i.e., sidewalls of the semiconductor dies 235) providing protection for the stack 245. The semiconductor die assembly 265a, however, includes sidewalls of the interface die 210 (i.e., sidewalls of the substrate 215 and the dielectric layer 220) exposed. Further, the sidewall surface of the dielectric layer 220 (or portions of the dielectric layer 220 proximate to the sidewall surface) may have been compromised—e.g., torn apart, delaminated, or otherwise damaged.

FIG. 2F also illustrates a semiconductor die assembly 265b after the heterogeneous material singulation process is complete. The semiconductor die assembly 265b includes the stack 245 of semiconductor dies 235, in which a NCF material disposed between the semiconductor dies 235. In some cases, the excess NCF material 290 may have squeezed out into the space between the stacks 245 during or upon completing the die stacking process described with reference to FIG. 2C. The excess NCF material 290 may have been cut during the blade singulation process. As such, the excess NCF material 290 is exposed without the molding structure confining the excess NCF material within the molding structure 260. The exposed sidewall surface of the NCF material 290 may render the semiconductor dies 235 prone to be influenced by the ambient conditions (e.g., humidity, heat) without having the protection that the molding structure 260 provides for.

FIGS. 3A through 3F illustrate stages of a process for forming semiconductor die assemblies in accordance with the present technology. More specifically, FIGS. 3A through 3F describes generating metal-free regions in the dielectric layer 220 such that a subsequent plasma dicing process can remove the metal-free regions. As a result of the plasma dicing process, the interface dies are singulated to ameliorate adverse effects from the stress during the WLP process steps. Moreover, sidewalls of the interface dies generated by the plasma dicing process can be protected by a molding structure during the blade singulation process.

Figure 3A:
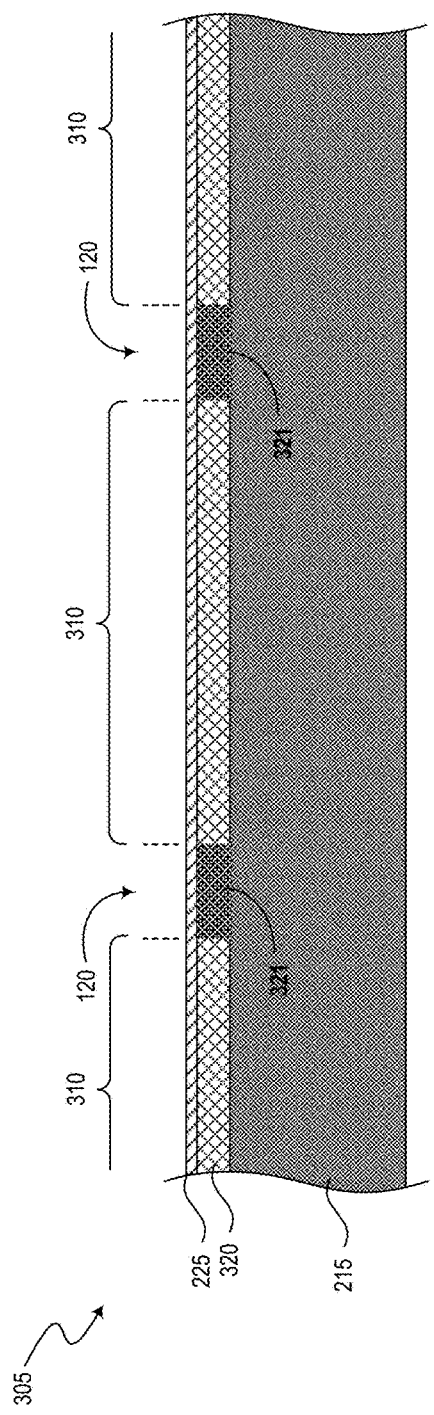

FIG. 3A illustrates a cross-sectional view of a portion of an interface wafer 305 (which may include aspects of the interface wafer 105 or 205) including interface dies 310 (which may include aspects of the interface dies 110 or 210). FIG. 3A illustrates generally similar features depicted in FIG. 2A such as the interface wafer 305 including the semiconductor substrate 215 with integrated circuitry (not shown) and the passivation layer 225.

Further, the interface wafer 305 includes a dielectric layer 320, which may include aspects of the dielectric layer 220. For example, the dielectric layer 320 includes various conductive components (e.g., one or more layers of metallic layers, conductive vias connecting the one or more metallic layers) configured to couple the integrated circuitry with other components of the interface die 310—e.g., bond pads, conductive bumps for external connections. As such, the dielectric layer 320 may also be referred to as a metallization layer. Also, the dielectric layer 320 may include a low-k dielectric material. Also depicted in FIG. 3A is that the dielectric layer 320 includes regions 321 where the conductive components are absent—e.g., metal-free regions 321.

In some embodiments, the layout of the conductive components in the dielectric layer 320 can be designed (laid out) such that the conductive components are removed in the regions 321 (or positioned in different areas of the dielectric layer 320 other than the regions 321). In some embodiments, the conductive components located in the regions 321 are removed (e.g., etched away) during the process steps fabricating the interface dies 310. As a result of creating the regions 321 that are free of the conductive components of the dielectric layer 320, the metal-free regions 321 (and portions of semiconductor substrate 215 corresponding to the regions 321) can be removed before disposing an encapsulating material without damaging the dielectric layer 320 as described herein with reference to FIG. 3C.

Figure 3B:
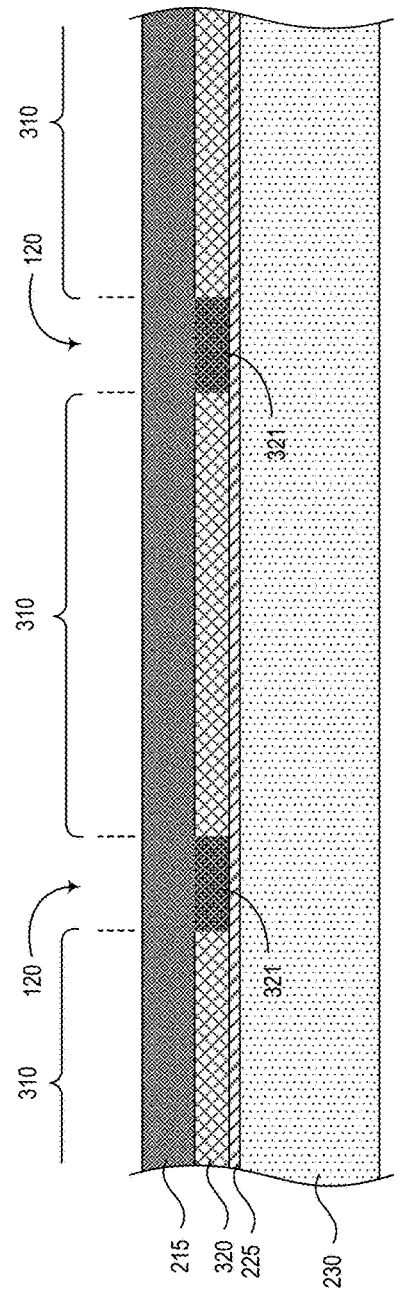

FIG. 3B illustrates the interface wafer 305 attached to a carrier substrate 230. FIG. 3B illustrates generally similar features described with reference to FIG. 2B. For example, at this stage of the process, the interface wafer 305 (e.g., bulk of the semiconductor substrate 215) may have been thinned down—e.g., to a thickness of 50 μm or so.

Figure 3C:
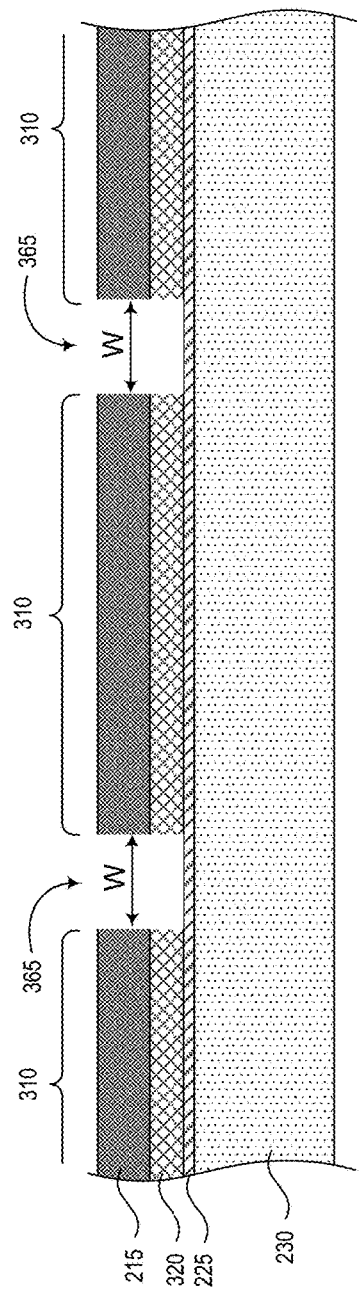

FIG. 3C illustrates that the metal-free regions 321 (and portions of the semiconductor substrate 215 corresponding to the metal-free regions 321) have been removed. In some embodiments, a plasma dicing process is utilized to remove the regions 321 (and the portions of semiconductor substrate 215). The plasma dicing process is expected to be benign (friendly) to the dielectric layer 320 and/or the semiconductor substrate 215. In this manner, the integrity of the dielectric layer 320 (and/or the semiconductor substrate 215) can be maintained—e.g., reducing or avoiding the dielectric layer 320 torn apart, delaminated, or otherwise damaged, which may occur during a mechanical dicing process. In other embodiments, conventional semiconductor fabrication process steps are used to remove the regions 321 (and the portions of the semiconductor substrate 215), such as plasma etching, wet etching, or other suitable techniques.

The process removing the regions 321 (and the portions of the semiconductor substrate 215) can stop on the passivation layer 225. As a result of removing the regions 321 (and the portions of the semiconductor substrate 215), spaces 365 are created between the interface dies 310. The spaces 365 have a width W and include scribe lines 120. At this stage of the process, although the interface wafer 305 is attached to the carrier substrate 230 (e.g., through the passivation layer 225), the interface dies 310 are singulated from the interface wafer 305—e.g., separated from each other by the spaces 365 having the width W.

Figure 3D:
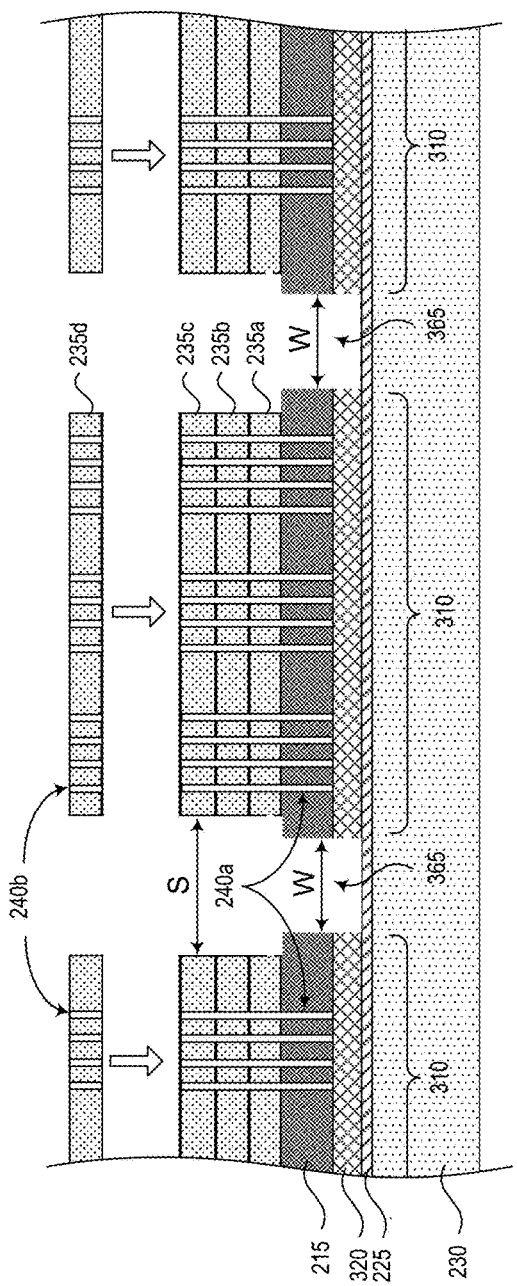

FIG. 3D illustrates that TSVs 240a are formed for the interface dies 310. The TSVs 240a are configured to operatively couple the integrated circuitry of the interface die 310 with the semiconductor dies 235. Further, FIG. 3D illustrates that semiconductor dies 235 (also identified individually as 235a-d) including TSVs 240b are attached to the interface wafer 305. TSVs 240b are configured to operatively couple the semiconductor dies 235 with the integrated circuitry of the interface dies 310. Also illustrated in FIG. 3D is the spaces S between the stacks of the semiconductor dies 235. The width (W) of the spaces 365 is less than the spaces S between the stacks of semiconductor dies 235.

In some embodiments, the bottommost semiconductor die of the stack (e.g., the semiconductor die 235a) is in direct contact with the interface die 310—e.g., without any intervening interconnect structures (e.g., joints) between the interface die 310 and the bottommost semiconductor die of the stack. In some embodiments, a hybrid bonding scheme (which may be referred to as a direct bonding scheme or a combinational bonding scheme) can be used to attach the bottommost semiconductor die of the stack to the interface die 310. Similarly, the individual semiconductors dies 235 of the stack may be in direct contact with each other—e.g., using the hybrid bond scheme.

FIG. 3E illustrates that top semiconductor dies 235e have been attached to the underlying core semiconductor dies 235 to complete the stacks 245 of semiconductor dies 235. FIG. 3E also depicts an encapsulating material 250 filling the spaces (denoted as S) between the stacks 245 and the spaces 365 (denoted to have the width W) between the interface dies 310. As a result of filling the spaces 365 with the encapsulating material 250 (i.e., creating regions 366 filled with the encapsulating material 250), the sidewall surfaces of the interface dies 310 are protected by the encapsulating material 250.

Moreover, as described above, the CTE mismatch between the encapsulating material 250 and other materials of the interface wafer 305 (e.g., silicon substrate 215, the stacks 245 of semiconductor dies 235) may result in stress throughout the interface wafer 305 during the molding process. The stress, however, may be confined (mitigated, limited, reduced) to the individual interface dies 310 in view of the spaces 365 (or the regions 366 filled with the encapsulating material 250) that is expected to facilitate local dissipation (or confinement) of the stress such that the long range propagation of the stress throughout the interface wafer 305 (which in turn, may cause warpage of the interface wafer) may be reduced.

FIG. 3F illustrates generally similar features depicted in FIG. 2E. For example, FIG. 3F illustrates that the carrier substrate 230 has been detached from the interface wafer 305 after the molding process, which is flipped upside down in comparison to FIG. 3E. FIG. 3F also illustrates that a dicing blade 255 can be used to singulate individual semiconductor die assemblies each including the interface die 310 and the stack 245 of the semiconductor dies 235. As shown in the embodiment depicted in FIG. 3F, the dicing blade 255 cuts through the passivation layer 225 and the encapsulating material 250 as the semiconductor substrate 215 and the dielectric layer 320 corresponding to the regions 366 have been removed as described with reference to FIG. 3C. Further, the cutting plane is away from the sidewall surfaces of the interface dies 310, the dielectric layer 320, which may include a low-k material, is protected during the mechanical dicing process (the blade singulation process). As a single dicing process is used to cut both the passivation layer 225 and the molding material 250, the sidewall surfaces of the passivation layer 225 and the molding material 250 may include a common surface texture—e.g., the surface texture created by the dicing blade 255.

Figure 4A:
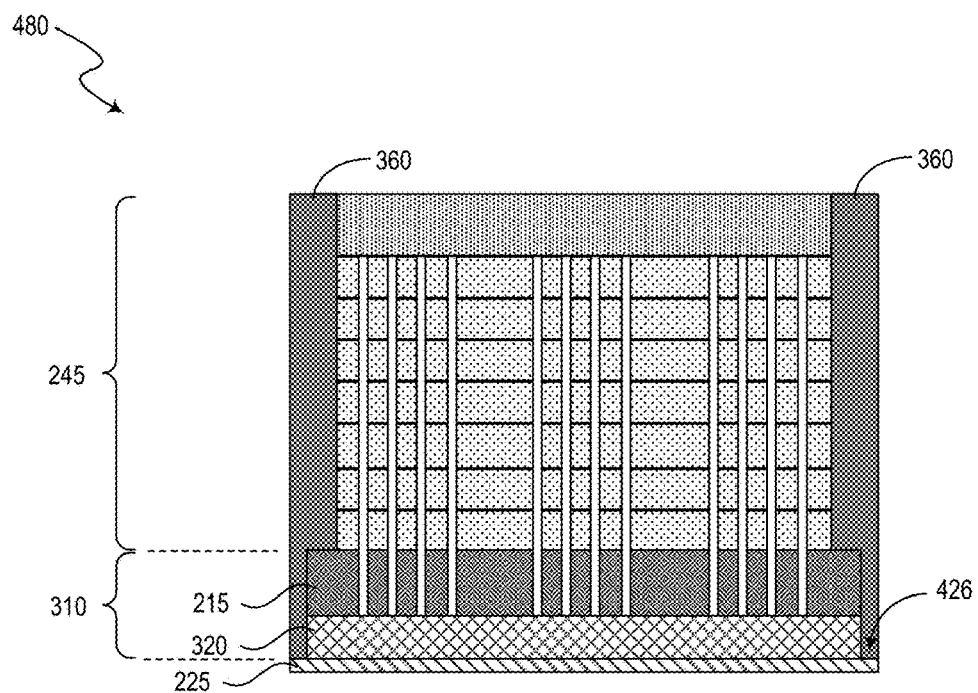
FIGS. 4A and 4B illustrate semiconductor die assemblies in accordance with embodiments of the present technology.

FIG. 4A illustrates a semiconductor die assembly 480 after the singulation process described with reference to FIG. 3F is complete. The semiconductor die assembly 480 is flipped upside down in comparison to that depicted in FIG. 3F. The semiconductor die assembly 480 includes a molding structure 360 (which may also be referred to as an encapsulating structure) including the encapsulation material 250. The molding structure 360 not only surrounds the sidewalls of the stack 245 (i.e., sidewalls of the semiconductor dies 235) providing protection for the stack 245, but also surrounds the sidewalls of the interface die 310—i.e., the sidewall surfaces of the semiconductor substrate 215 and the dielectric layer 320. In this manner, the sidewall surfaces of the semiconductor substrate 215 and the dielectric layer 320 are also protected by the molding structure 360. For the semiconductor die assembly 480 depicted in FIG. 4A, the sidewalls of the semiconductor substrate 215 are flush with corresponding sidewalls of the dielectric layer 320—i.e., the sidewalls of the semiconductor substrate 215 and the dielectric layer 320 are generally in coplanar surfaces.

Further, the semiconductor die assembly 480 includes the passivation layer 225 with its sidewall surfaces coplanar with the outer sidewall surfaces of the molding structure 360, which is a result of the dicing process described with reference to FIG. 3F cutting the passivation layer 225 and the encapsulation material 250 in a single pass. As such, the sidewall surfaces of the passivation layer 225 and the molding structure 360 (e.g., outer sidewall surface of the molding structure 360) may include a common surface texture—e.g., the surface texture created by the dicing blade 255. The passivation layer 225 also includes a ledge 426 (or a porch) uncovered by the dielectric layer 320 (or the interface die 310). In other words, the passivation layer 225 is offset with respect to the dielectric layer 320 (or the interface die 310) such that the encapsulating material 250 "sits on" the ledge 426 of the passivation layer 225.

In some embodiments, the ledge 426 is covered by the molding structure 360. As shown in the embodiment depicted in FIG. 4A, the molding structure 360 is in contact with the ledge 426. Moreover, the molding structure 360 surrounds the sidewalls of the substrate 215, the sidewalls of the dielectric layer 320, and the sidewalls of the memory dies 235 (i.e., the sidewalls of the stack 245). In some embodiments, the molding structure 360 has a top surface coplanar with another top surface of the top semiconductor die (e.g., the semiconductor die 235e of the stack 245), which may be a result of the grinding process that removes the excess encapsulating material 250 during the molding process.

Figure 4B:
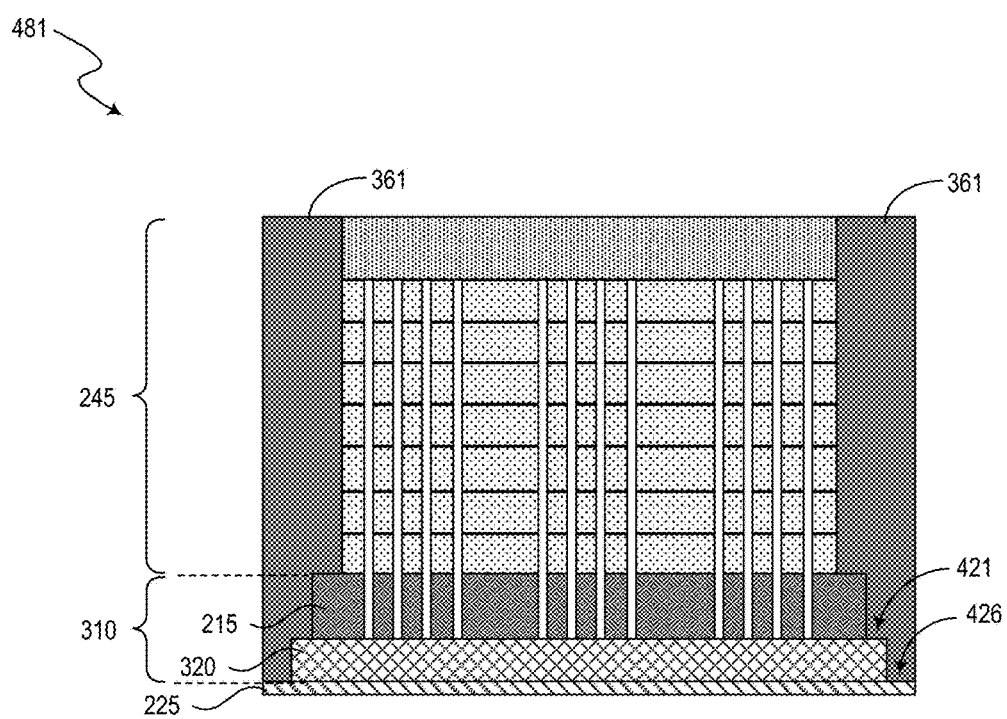

FIG. 4B illustrates a semiconductor die assembly 481 after the singulation process described with reference to FIG. 3F is complete. The semiconductor die assembly 481 includes generally similar features of the semiconductor die assembly 481. For example, the semiconductor die assembly 481 includes a molding structure 361 with the encapsulation material 250, which surrounds and protect the sidewalls of the stack 245 and the sidewalls of the interface die 310—i.e., the sidewall surfaces of the semiconductor substrate 215 and the dielectric layer 320. The passivation layer 225 includes the ledge 426 uncovered by the dielectric layer 320 (or the interface die 310). Further, the dielectric layer 320 of the semiconductor die assembly 481 includes a ledge 421 (or a porch) uncovered by the semiconductor substrate 215—i.e., the sidewalls of the semiconductor substrate 215 and the sidewalls of the dielectric layer 320 are not in coplanar surfaces. In this regard, the passivation layer 225 is offset with respect to the dielectric layer 320, which is further offset with respect to the substrate 215 such that the encapsulating material 250 "sits on" the ledge 421 of the dielectric layer 320 and the ledge 426 of the passivation layer 225.

In some embodiments, the ledge 421 is covered by the molding structure 360. As shown in the embodiment depicted in FIG. 4B, the molding structure 361 is in contact with the ledge 421 and the ledge 426. Moreover, the molding structure 361 surrounds the sidewalls of the substrate 215, the sidewalls of the dielectric layer 320, and the sidewalls of the memory dies 235 (i.e., the sidewalls of the stack 245). The passivation layer 225 has its sidewall surfaces coplanar with the outer sidewall surfaces of the molding structure 361, which is a result of the dicing process described with reference to FIG. 3F cutting the passivation layer 225 and the encapsulation material 250 in a single pass. As such, the sidewall surfaces of the passivation layer 225 and the molding structure 361 (e.g., outer sidewall surface of the molding structure 361) may include a common surface texture—e.g., the surface texture created by the dicing blade 255. Moreover, the molding structure 361 has a top surface coplanar with another top surface of the top semiconductor die (e.g., the semiconductor die 235e of the stack 245).

FIGS. 5A through 5D illustrate stages of a process for forming semiconductor die assemblies in accordance with the present technology. More specifically, FIGS. 5A through 5D describes utilizing a laser dicing process (a full laser cutting process) that can remove the conductive structures (e.g., metal layers and/or vias therebetween) in the dielectric layer. Accordingly, creating the metal-free regions (e.g., the metal-free regions 321) is not necessary. Moreover, if excess NCF materials are present between the stacks of semiconductor dies after the stacking process, the laser dicing process removes portions of the NCF materials such that subsequent molding process steps can contain the remaining NCF materials. As such, the NCF materials are not exposed during the blade singulation process. Moreover, as a result of the laser dicing process, the interface dies are singulated to ameliorate adverse effects from stress during the WLP process steps, and the sidewalls of the interface dies generated by the laser dicing process can be protected with a molding structure during the blade singulation process.

FIG. 5A illustrates a cross-sectional view of a portion of the interface wafer 205 after stacking semiconductor dies 235 to form stacks 246 on the interface wafer (e.g., the stacking process described with reference to FIG. 2C). The semiconductor dies 235 of the stack 246 may have been stacked on top of each other through interconnect structures (e.g., joints). Moreover, during the stacking process, a NCF material may have been used to provide dielectric isolation between the adjacent semiconductors dies 235 and among the interconnect structures between the semiconductors dies 235. The NCF materials can flow relatively freely during the stacking process such that it can fill the space between the semiconductor dies 235 and among the interconnect structures. In some cases, excess NCF material 290 may squeeze out from the stacks 246 into the space S between the stacks 246.

FIG. 5B illustrates the interface wafer 205 after completing a laser dicing process. As a result of the laser dicing process, the interface dies 210 (attached to the carrier substrate 230) are singulated with space W between them. As shown in FIG. 5B, portions of the excess NCF material 290 are removed after the laser dicing process. The laser dicing process also removes portions of the semiconductor substrate 215, the dielectric layer 220, and the passivation layer 225. The laser dicing process may stop on the carrier substrate 230. Moreover, the laser dicing process may result in a sloped side wall on the composite stack of the semiconductor substrate 215, the dielectric layer 220, and the passivation layer 225.

FIG. 5C illustrates the interface wafer 205 after completing a molding process that fills the space W with the encapsulation material 250 (e.g., EMC)—e.g., the molding process described with reference to FIG. 2D. It should be noted that as the interface dies 210 have been singulated by the laser dicing process, the stress associated with the molding process is expected to be mitigated—e.g., confined at the individual die level without propagating throughout the interface wafer 205.

Figure 6:
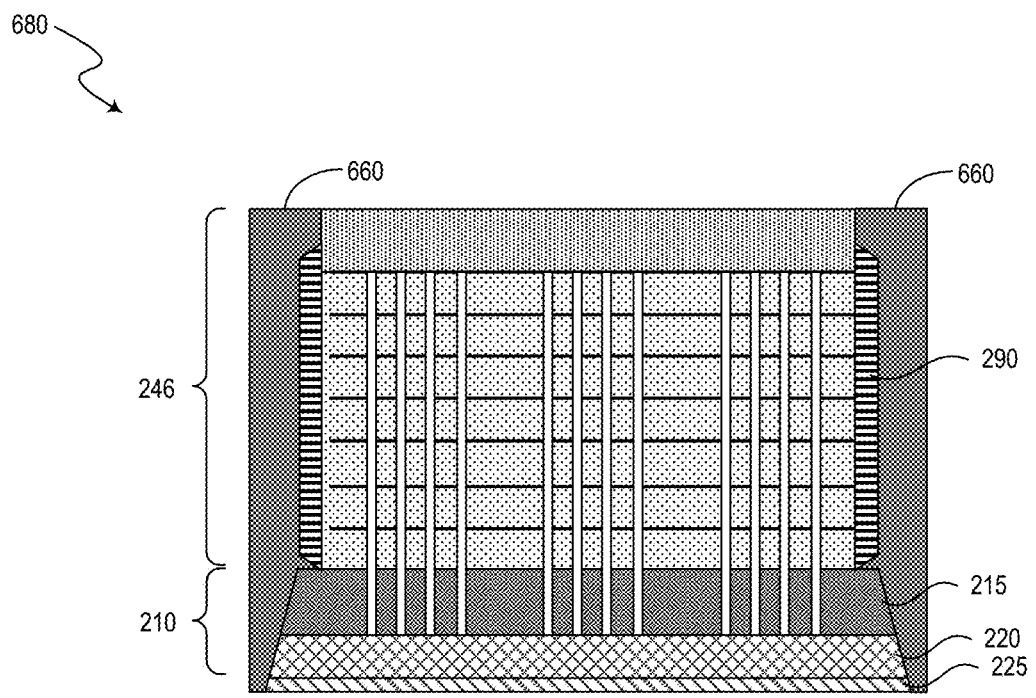
FIG. 6 illustrates a semiconductor die assembly in accordance with embodiments of the present technology.
Figure 7:
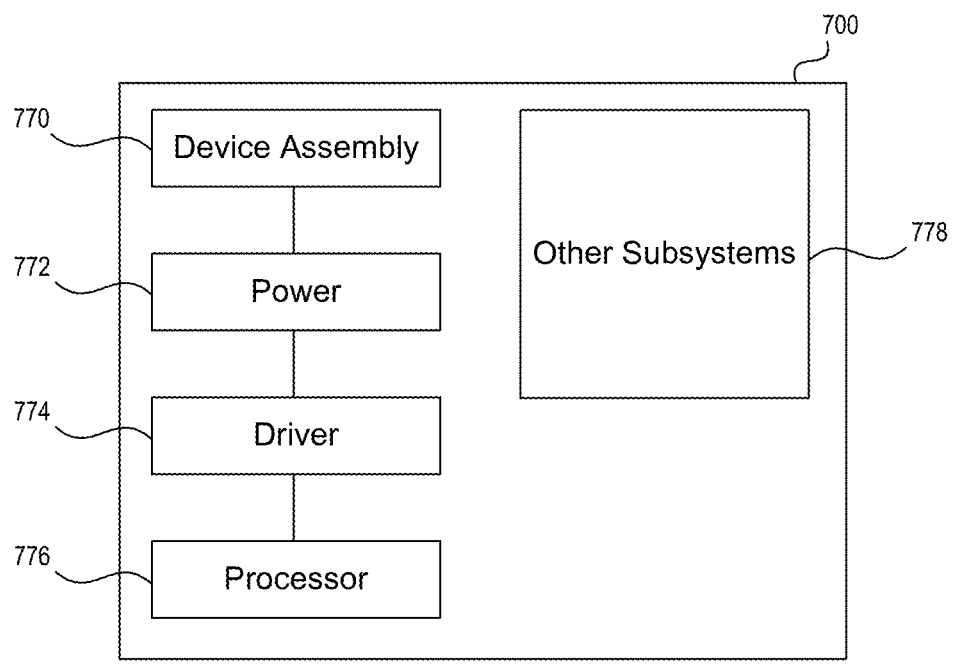
FIG. 7 is a block diagram schematically illustrating a system including a semiconductor die assembly in accordance with embodiments of the present technology.

FIG. 5D illustrates generally similar features depicted in FIG. 2E. For example, FIG. 5D illustrates that the carrier substrate 230 has been detached from the interface wafer 205 after the molding process, which is flipped upside down in comparison to FIG. 5C. FIG. 5D also illustrates that a dicing blade 255 can be used to singulate individual semiconductor die assemblies each including the interface die 210 and the stack 246 of the semiconductor dies 235. As shown in the embodiment depicted in FIG. 5D, the dicing blade 255 cuts through only the encapsulating material 250 as the passivation layer 225, the semiconductor substrate 215, and the dielectric layer 220 corresponding to the cutting plane have been removed during the laser dicing process step. Further, as the cutting plane is away from the sidewall surfaces of the interface dies 210, the dielectric layer 220, and the excess NCF material 290, the entire sidewall surfaces of the resulting individual semiconductor die assemblies are protected during the mechanical dicing process (the blade singulation process). FIG. 6 illustrates a semiconductor die assembly 680 after the singulation process described with reference to FIG. 5D is complete. The semiconductor die assembly 680 is flipped upside down in comparison to that depicted in FIG. 5D. The semiconductor die assembly 680 includes a molding structure 660 (which may also be referred to as an encapsulating structure) including the encapsulation material 250. The molding structure 660 not only surrounds the sidewalls of the stack 246 (i.e., sidewalls of the semiconductor dies 235) providing protection for the stack 246, but also surrounds the sidewalls of the interface die 210—i.e., the sidewall surfaces of the semiconductor substrate 215 and the dielectric layer 220. In this manner, the sidewall surfaces of the semiconductor substrate 215 and the dielectric layer 220 are also protected by the molding structure 660.

The laser dicing process used to generate the semiconductor die assembly 680 may generate the sloped sidewalls of the interface die 210—i.e., the sloped sidewalls of the semiconductor substrate 215 and the dielectric layer 220. Further, the semiconductor die assembly 680 includes the excess NCF material 290 confined within the molding structure 660. In some embodiments, the NCF material 290 is not used to form the stack of semiconductor dies (e.g., using hybrid bonding). In such embodiments, the semiconductor die assembly 680 does not include the NCF material 290.

The semiconductor die assemblies 480, 481, or 680 described with reference to FIGS. 4A/4B and 6 can be incorporated into any of a myriad of larger and/or more complex systems, a representative example of which is the system 700 shown schematically in FIG. 5. The system 700 can include the semiconductor die assembly 770, a power source 772, a driver 774, a processor 776, and/or other subsystems or components 778.

The semiconductor die assembly 770 can include features generally similar to those included in the semiconductor die assemblies 480/481 or 680. For example, the semiconductor die assembly 770 includes an interface die having a low-k dielectric layer. Further, the semiconductor die assembly 770 includes a stack of semiconductor dies that the interface die carries. Additionally, the semiconductor die assembly 770 includes a molding structure that surrounds the sidewalls of the interface die and the sidewalls of the stack of semiconductor dies. The resulting system 700 can perform any of a wide variety of functions, such as memory storage, data processing, and/or other suitable functions. Accordingly, representative systems 700 can include, without limitation, hand-held devices (e.g., mobile phones, tablets, digital readers, and digital audio players), computers, and appliances. Components of the system 700 may be housed in a single unit or distributed over multiple, interconnected units (e.g., through a communications network). The components of the system 700 can also include remote devices and any of a wide variety of computer readable media.

In some embodiments, a semiconductor die assembly includes a controller die including a substrate having a first side in contact with a dielectric layer including a low-k dielectric material and conductive components coupled to integrated circuitry of the substrate, one or more memory dies attached to a second side of the substrate opposite to the first side, the one or more memory dies operatively coupled to the integrated circuitry, a passivation layer in contact with the dielectric layer, where the passivation layer is opposite to the substrate of the controller die, and where the passivation layer includes a ledge uncovered by the dielectric layer, and a molding structure in contact with the ledge and surrounding first sidewalls of the substrate, second sidewalls of the dielectric layer, and third sidewalls of the one or more memory dies. In some embodiments, the passivation layer has a first sidewall surface coplanar with a second sidewall surface of the molding structure. In some embodiments, the first and second sidewall surfaces have been formed by a single dicing process.

Figure 8:
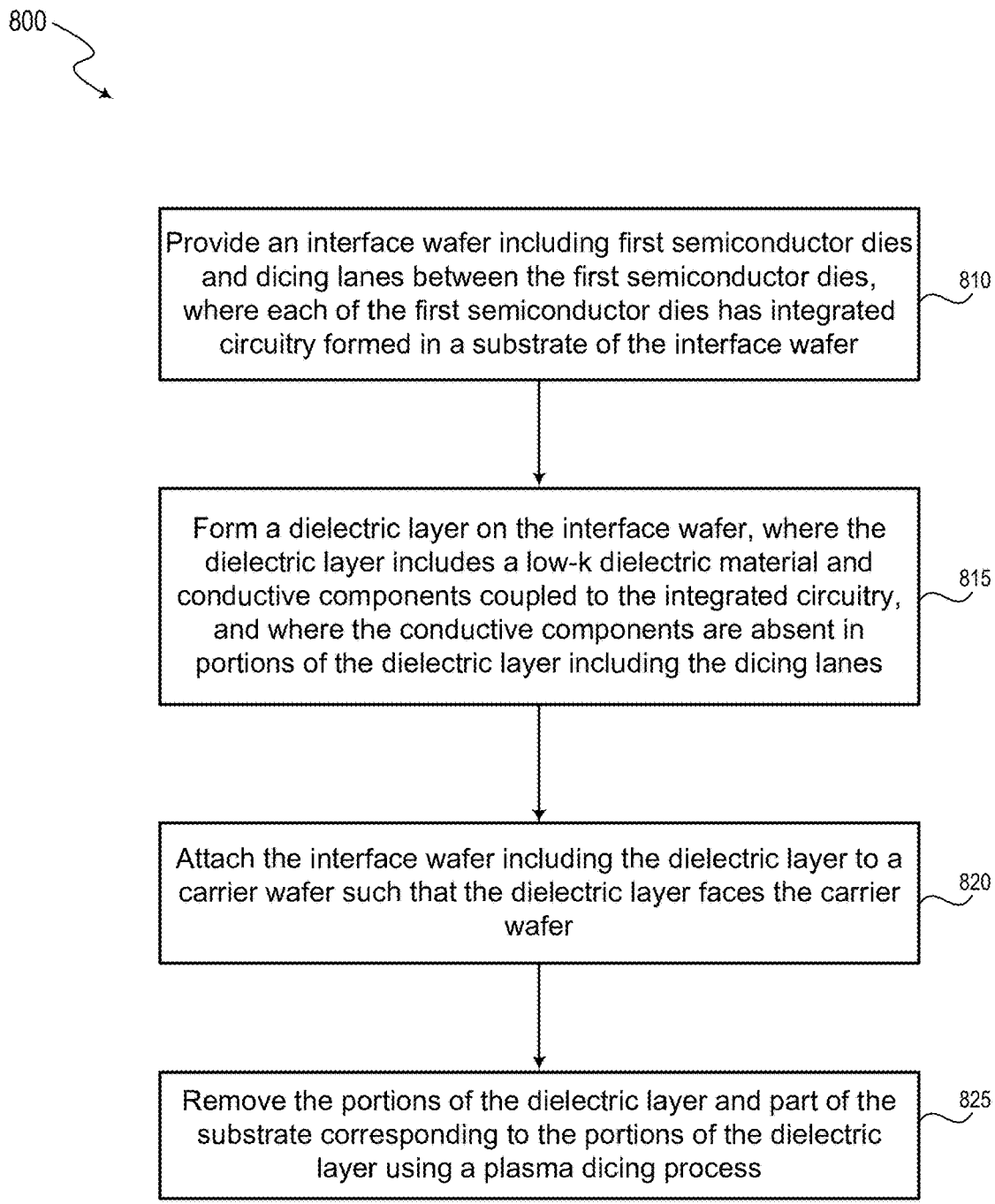
FIG. 8 is a flowchart of a method of forming a semiconductor die assembly in accordance with embodiments of the present technology.

FIG. 8 is a flowchart 800 of a method of forming a semiconductor die assembly (e.g., the semiconductor die assembly 480 or 481) in accordance with embodiments of the present technology. The flowchart 800 may include aspects of methods as described with reference to FIGS. 1 and 3A-3F.

The method includes providing an interface wafer including first semiconductor dies and dicing lanes between the first semiconductor dies, where each of the first semiconductor dies has integrated circuitry formed in a substrate of the interface wafer (box 810). The method further includes forming a dielectric layer on the interface wafer, where the dielectric layer includes a low-k dielectric material and conductive components coupled to the integrated circuitry, and where the conductive components are absent in portions of the dielectric layer including the dicing lanes (box 815). The method further includes attaching the interface wafer including the dielectric layer to a carrier wafer such that the dielectric layer faces the carrier wafer (box 820). The method further includes removing the portions of the dielectric layer and part of the substrate corresponding to the portions of the dielectric layer using a plasma dicing process (box 825).

In some embodiments, the plasma dicing process stops on a passivation layer after removing the portions of the dielectric material and the part of the substrate, the passivation layer being located between the dielectric layer and the carrier wafer. In some embodiments, the method further includes forming a passivation layer on the dielectric layer prior to attaching the interface wafer to the carrier wafer such that the passivation layer is located between the dielectric layer and the carrier wafer after attaching the interface wafer to the carrier wafer. In some embodiments, the method further includes attaching one or more second semiconductor dies on each of the first semiconductor dies, where the one or more second semiconductor dies are operatively coupled with a corresponding first semiconductor die.

In some embodiments, the method further includes applying a molding material after attaching the one or more second semiconductor dies such that the molding material fills at least spaces between the first semiconductor dies, where the spaces correspond to the portions of the dielectric material and the part of the substrate, which have been removed by the plasma dicing process. In some embodiments, the method further includes detaching the carrier wafer from the passivation layer. In some embodiments, the method further includes singulating individual first semiconductor dies with the one or more second semiconductors attached thereto using a blade dicing process configured to remove the passivation layer and the molding material corresponding to the dicing lanes.

It should be noted that the methods described above describe possible implementations, and that the operations and the steps may be rearranged or otherwise modified and that other implementations are possible. Furthermore, embodiments from two or more of the methods may be combined. Further, it will be appreciated that specific embodiments of the technology have been described herein for purposes of illustration, but that various modifications may be made without deviating from the disclosure.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." The term "exemplary" used herein means "serving as an example, instance, or illustration," and not "preferred" or "advantageous over other examples."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
   a first semiconductor die including a substrate having a first side in contact with a dielectric layer having a low-k dielectric material and conductive components coupled to integrated circuitry of the substrate;
   one or more second semiconductor dies attached to a second side of the substrate opposite to the first side, the one or more second semiconductor dies operatively coupled to the integrated circuitry;
   a monolithic encapsulating mold material surrounding the first semiconductor die and the one or more second semiconductor dies, the monolithic encapsulating mold material directly contacting first sidewalls of the substrate, second sidewalls of the dielectric layer, and third sidewalls of the one or more second semiconductor dies; and
   a passivation layer in contact with the dielectric layer, wherein the passivation layer is opposite to the substrate of the first semiconductor die,
   wherein the dielectric layer includes a ledge uncovered by the substrate, the ledge being in contact with the monolithic encapsulating mold material.

2. The semiconductor die assembly of claim 1, wherein the passivation layer has a first sidewall surface coplanar with a second sidewall surface of the monolithic encapsulating mold material.

3. The semiconductor die assembly of claim 2, wherein the first and second sidewall surfaces have been formed by a single dicing process.

4. The semiconductor die assembly of claim 1, wherein:
   the ledge uncovered by the substrate is a first ledge; and
   the passivation layer includes a second ledge uncovered by the dielectric layer, the second ledge being in contact with the monolithic encapsulating mold material.

5. The semiconductor die assembly of claim 1, wherein the monolithic encapsulating mold material surrounds the third sidewalls of the one or more second semiconductor dies.

6. The semiconductor die assembly of claim 1, wherein the monolithic encapsulating mold material has a first top surface coplanar with a second top surface of an uppermost second semiconductor die.

7. The semiconductor die assembly of claim 1, wherein the first sidewalls of the substrate are flush with corresponding second sidewalls of the dielectric layer.

8. The semiconductor die assembly of claim 1, wherein:
the first semiconductor die includes first through-substrate vias (TSVs) configured to operatively couple the integrated circuitry with the one or more second semiconductor dies; and
the one or more second semiconductor dies include second TSVs configured to operatively couple the one or more second semiconductor dies with the integrated circuitry of the first semiconductor die.

9. The semiconductor die assembly of claim 1, wherein a bottommost second semiconductor die of the one or more second semiconductor dies is in direct contact with the first semiconductor die.

10. The semiconductor die assembly of claim 1, wherein:
the first semiconductor die includes a memory controller die; and
the one or more second semiconductor dies include memory dies.

11. A semiconductor die assembly, comprising:
a controller die including a substrate having a first side in contact with a dielectric layer including a low-k dielectric material and conductive components coupled to integrated circuitry of the substrate, wherein the dielectric layer includes a first ledge uncovered by the substrate;
one or more memory dies attached to a second side of the substrate opposite to the first side, the one or more memory dies operatively coupled to the integrated circuitry;
a passivation layer in contact with the dielectric layer, wherein the passivation layer is opposite to the substrate of the controller die, and wherein the passivation layer includes a second ledge uncovered by the dielectric layer; and
a monolithic encapsulating mold material in direct contact with the first ledge and the second ledge, the monolithic encapsulating mold material directly contacting first sidewalls of the substrate, second sidewalls of the dielectric layer, and third sidewalls of the one or more memory dies.

12. The semiconductor die assembly of claim 11, wherein the passivation layer has a first sidewall surface coplanar with a second sidewall surface of the monolithic encapsulating mold material, and wherein the first and second sidewall surfaces have been formed by a single dicing process.

* * * * *